(12) United States Patent
Gunner et al.

(10) Patent No.: US 7,326,653 B2
(45) Date of Patent: Feb. 5, 2008

(54) METHOD OF PREPARATION OF ORGANIC OPTOELECTRONIC AND ELECTRONIC DEVICES AND DEVICES THEREBY OBTAINED

(75) Inventors: Alec Gunner, Cambridgeshire (GB); Martin Cacheiro, A Coruña (ES)

(73) Assignee: Cambridge Display Technology Limited, Cambridgeshire (GB)

( * ) Notice: Subject to any disclaimer, the term of this patent is extended or adjusted under 35 U.S.C. 154(b) by 85 days.

(21) Appl. No.: 10/509,311

(22) PCT Filed: Mar. 21, 2003

(86) PCT No.: PCT/GB03/01214

§ 371 (c)(1),
(2), (4) Date: Apr. 8, 2005

(87) PCT Pub. No.: WO03/083960

PCT Pub. Date: Oct. 9, 2003

(65) Prior Publication Data

US 2005/0196969 A1 Sep. 8, 2005

(30) Foreign Application Priority Data

Mar. 27, 2002 (GB) .................. 0207134.8

(51) Int. Cl.
*H01L 21/302* (2006.01)
*H01L 21/461* (2006.01)
*H01L 21/44* (2006.01)
*B41J 2/45* (2006.01)

(52) U.S. Cl. ............... 438/725; 438/684; 257/E21.256; 257/E21.264; 257/E51.022; 257/E51.014; 257/E51.029; 347/238

(58) Field of Classification Search ............... 438/689, 438/725; 257/E21.256, E21.264, E51.022, 257/E51.014, E51.029; 347/238
See application file for complete search history.

(56) References Cited

U.S. PATENT DOCUMENTS 4,539,507 A 9/1985 VanSlyke et al. ........... 313/504

(Continued)

FOREIGN PATENT DOCUMENTS

EP 880 303 B1 11/1998

(Continued)

OTHER PUBLICATIONS

"Patterning π-Conjugated Polymers", Steven Holdcroft, Advanced Materials 13, No. 23, Dec. 3, 2001, pp. 1753-1765.
International Search Report in PCT/GB03/01214 dated Aug. 20, 2003.

*Primary Examiner*—Walter L Lindsay, Jr.
(74) *Attorney, Agent, or Firm*—Marshall, Gerstein & Borun LLP (57) ABSTRACT

A method for preparing an organic electronic or optoelectronic device is described. The method comprises depositing a layer of fluorinated polymer on a substrate, patterning the layer of fluorinated polymer to form a relief pattern and depositing from solution a layer of organic semiconductive or conductive material on the substrate. The fluorinated polymer may be a fluorinated photoresist and may be treated by exposure to ultraviolet light and ozone prior to the deposition of the layer of organic semiconductive or conductive material. The method has particular application in the preparation of organic light emitting devices by ink-jet printing.

37 Claims, 3 Drawing Sheets

U.S. PATENT DOCUMENTS

| | | |
|---|---|---|
| 5,670,791 A | 9/1997 | Halls et al. .................... 257/40 |
| 5,904,154 A | 5/1999 | Chien et al. .................. 134/1.2 |
| 6,080,031 A | 6/2000 | Rogers et al. ................. 445/25 |
| 2003/0143845 A1 | 7/2003 | Mori et al. .................. 438/689 |
| 2004/0082183 A1 | 4/2004 | Mori ........................... 438/704 |
| 2006/0105269 A1* | 5/2006 | Khojasteh et al. ....... 430/270.1 |
| 2006/0145365 A1* | 7/2006 | Halls et al. .......... 257/E51.022 |

FOREIGN PATENT DOCUMENTS

| | | |
|---|---|---|
| EP | 0 884 930 | 12/1998 |
| EP | 901 176 B1 | 3/1999 |
| EP | 949 850 B1 | 10/1999 |
| EP | 969 701 A1 | 1/2000 |
| EP | 989 778 A1 | 3/2000 |
| EP | 1 176 850 | 1/2002 |
| JP | 2001-326069 | 11/2001 |
| JP | 2003-283103 | 10/2003 |
| JP | 3901156 | 4/2007 |
| WO | WO 90/13148 | 11/1990 |
| WO | WO 97/42666 | 11/1997 |
| WO | WO 98/05187 | 2/1998 |
| WO | WO 98/21626 | 5/1998 |
| WO | WO 00/36661 | 6/2000 |
| WO | WO 00/67072 | 11/2000 |
| WO | WO 00/70406 | 11/2000 |
| WO | WO 00/76008 A1 | 12/2000 |
| WO | WO 01/16251 A1 | 3/2001 |
| WO | WO 01/47043 A1 | 6/2001 |
| WO | WO 01/47045 A1 | 6/2001 |

* cited by examiner

METHOD OF PREPARATION OF ORGANIC OPTOELECTRONIC AND ELECTRONIC DEVICES AND DEVICES THEREBY OBTAINED

This is the U.S. national phase of International Application No. PCT/GB03/01214 filed Mar. 21, 2003, the entire disclosure of which is incorporated herein by reference.

FIELD OF THE DISCLOSURE

The present disclosure relates to a method for preparing organic electronic and optoelectronic devices using solution processing and to the substrates and devices thereby obtained.

BACKGROUND OF THE DISCLOSURE

There has been an increasing amount of research into the use of organic materials in electronic and optoelectronic devices, examples of such devices include organic electroluminescent devices, as disclosed in WO90/13148 and U.S. Pat. No. 4,539,507, organic photovoltaic devices, as disclosed in U.S. Pat. No. 5,670,791 and organic transistors as disclosed in WO01/47043. Organic semiconductive and conductive polymers have proven to be of particular use in organic electronic and optoelectronic devices due in large part to their processability and in particular their solution processability which enable them to be formed into devices using a range of coating and printing techniques. The use of such techniques gives rise to the potential for low cost, easily manufacturable polymeric organic electronic and optoelectronic devices, such as displays and plastic microchips. Ink-jet printing has recently emerged as an important method in the preparation of organic electronic and optoelectronic devices, ink-jet printed organic electroluminescent devices are disclosed in EP0880303 and ink-jet printed transistors in the aforementioned WO01/47043.

The preparation of organic electronic and optoelectronic devices by solution processing requires a high degree, of pattern resolution, of the order of 10 microns. To achieve such high levels of resolution using solution processing techniques it has been found necessary to provide relief patterns on the substrates onto which the organic material is to be coated or printed, these relief pattern prevent the organic material spreading into unwanted areas. EP0980778 discloses relief patterns in the form of banks of photoresist which allow semiconductive polymers to be deposited in series of parallel lines, it has been found that the surface properties of the substrate and the material of the relief pattern have a great influence on the behaviour of the deposited organic material. It is desirable that the material of the substrate has a wetting surface and so becomes coated with the deposited solution of organic material, the solution of organic material then has a low contact angle on the surface of the material of the substrate, and it is desireable that the material of the relief pattern has a non-wetting surface and so does not become coated with the deposited solution of organic material, the solution of organic material then has a high contact angle on the surface of the substrate. In particular for depositing organic materials on selected areas of a substrate the difference in contact angles between regions where it is desired to deposit the organic material and regions where it is not desired to deposit the organic material should be a large as possible. In the aforementioned EP0989778 a relief pattern of a polyimide photoresist in the form of banks is formed on a glass substrate coated with a layer of indium-tin oxide (ITO) this patterned substrate is exposed to a $O_2/CF_4$ plasma treatment which increases the contact angle of the solution of organic material at the polyimide and decreases the contact angle of the solution of organic material at the ITO, allowing aqueous solutions of semiconductive or conductive polymers to be deposited into the channels formed by the banks without overflowing into neighbouring channels or into unwanted areas.

Although the above mentioned $O_2/CF_4$ plasma treatment of substrates having polyimide relief patterns has become established as the method of choice in preparing substrates for organic electronic and optoelectronic devices the process has a number of disadvantages in that it requires relatively complex processing equipment, such as vacuum and plasma systems, and use of environmentally harmful gases. Further although it is thought that the treatment results in a partial fluorination of the surface of the polyimide material, as discussed in U.S. Pat. No. 5,904,154, this fluorination is only temporary and the surface properties of the polyimide change over time. Additionally the $O_2/CF_4$ plasma treatment must be carried out over a period of time of the order of tens of minutes, such long processing times are thought to have a deleterious effect on the lifetime of the organic electronic or optoelectronic devices. Another disadvantage of the prior art $O_2/CF_4$ plasma process is that it must be carried out as a batch process in a vacuum chamber whereas it is generally preferred to use continuous processes which may be readily integrated into production lines. This disclosure provides a method for the preparation of substrates for organic electronic and optoelectronic devices which provides permanently fluorinated relief features, does not require prior conditioning of the surface relief features, nor does it require complex equipment or environmentally harmful gases, it allows shorter processing times and may be operated as a continuous process.

SUMMARY OF THE DISCLOSURE

The disclosure provides a process in which a fluorinated photoresist is substituted for the prior art polyimide photoresists. Patterned fluorinated photoresists provide surface features which repel deposited solutions of semiconductive or conductive materials and so allow solutions of semiconductive or conductive materials to be deposited patternwise onto a substrate. The use of patterned fluorinated photoresists provides substrates with sufficient difference in the surface energies of the regions of the substrate in which it is desired to deposit material and the regions of the substrate in which it is not desired to deposit material for patterns of organic conductive or semiconductive materials to be provided on the substrate.

DETAILED DESCRIPTION

In a first embodiment the disclosure provides a method for preparing an organic electronic or optoelectronic device comprising depositing a layer of fluorinated photoresist on a substrate, patterning said layer of fluorinated photoresist to form a relief pattern and depositing from solution a layer of organic semiconductive or conductive material on said substrate.

A photoresist is a photoimaging material, generally applied as a thin film, whose local solubility properties can be altered photochemically with a subsequent developing step producing an image. The fluorinated photoresists of the disclosure differ from the fluorinated polymers of the prior art which have been suggested for use in organic optoelectronic devices in that the fluorinated polymers of the prior art are not photoresists and therefore require several extra processing steps to pattern them, see for example WO00/76008 which discloses a process for patterning a fluorinated polymer requiring a plasma etching step.

For the purposes of the disclosure fluorinated photoresists are considered to comprise those photoresists which include covalently bound fluorine throughout the bulk material as opposed to photoresists only the surfaces of which have been fluorinated. Examples of photoresists only the surfaces of which have been fluorinated include $O_2/CF_4$ plasma treated polyimides and polyimides which have been treated with other fluorinating agents such as, for example siloxanes comprising fluorinated moieties. Examples of fluorinated photoresists include copolymers of fluorinated monomers and photoactive monomers such as are disclosed in WO00/67072. The fluorinated photoresist preferably comprises a fluorinated polyimide, in particular fluorinated polyimides comprising copolymers of photoactive imide moieties and fluorinated alkyl moieties are preferred.

Figure 4A:
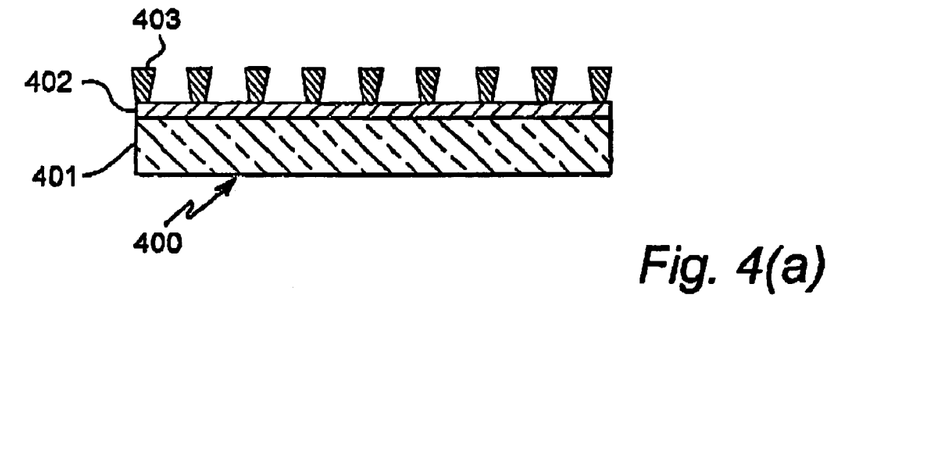
FIGS. 4(a) and (b) show substrates with patterned layers of fluorinated photoresist in the form of banks and wells.
Figure 4B:
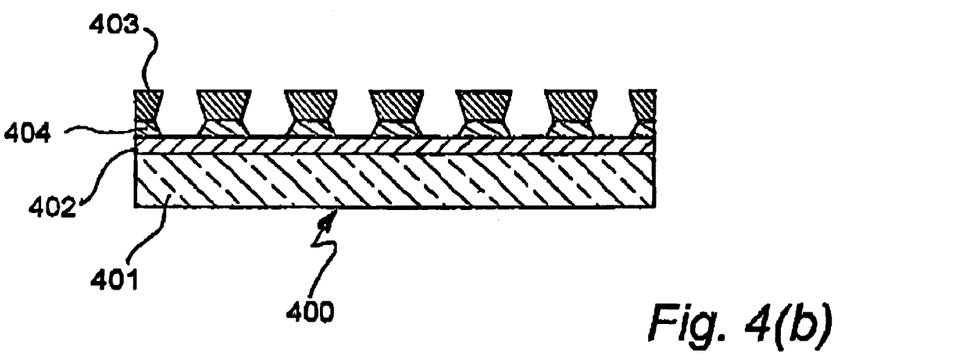

The patterning of said layer of fluorinated photoresist may comprise a photolithographic process. The relief pattern of said layer of fluorinated photoresist preferably comprises bands or wells. For the purpose of the disclosure banks are considered to comprise raised portions of photoresist on the substrate, said raised portions having a one dimensional pattern and preferably forming a series of parallel lines. Wells are considered to comprise recessed portions in the layer of photoresist, a plurality of these recessed portions being arranged in a two dimensional pattern. The structures of banks and wells are illustrated in FIGS. 1(f) and 1(g). It is preferred that said wells have a positive wall profile for better retaining the deposited solution, wells having a positive wall profile are illustrated in FIG. 4(b).

In a particular embodiment substrates comprising a layer of fluorinated photoresist patterned in the form of wells may comprise a further, overlying, layer of photoresist patterned to form banks. For the purposes of further processing of the substrates of the disclosure into organic optoelectronic and electron devices it is preferred that banks of fluorinated photoresist have a negative wall profile, the profile of the banks being narrower at the substrate surface. FIG. 4(a) shows a substrate having fluorinated photoresist banks having a negative wall profile, FIG. 4(b) shows a substrate having fluorinated photoresist wells with a positive wall profile and an overlying layer of fluorinated photoresist banks having a negative wall profile. A negative wall profile is also known as an undercut profile.

It is preferred that the substrate and the patterned fluorinated photoresist are further treated to modify the surface energy of the substrate prior to depositing from solution a layer of organic semiconductive or conductive material on said substrate. This treatment may comprise exposing said substrate and said patterned layer of fluorinated photoresist to argon plasma, atmospheric plasma, ultraviolet light and ozone (UV/ozone), oxygen plasma, aqua regia, peroxides or other oxidising species. In a particularly preferred embodiment said substrate and said patterned layer of fluorinated photoresist are exposed to ultraviolet light and ozone prior to depositing from solution a layer of organic semiconductive or conductive material on said substrate. It has been determined that this treatment renders the substrate particularly suitable for forming well defined, patterned layers of organic semiconductive or conductive material from solution.

It is preferred that said step of exposing said substrate and said patterned layer of fluorinated photoresist to ultraviolet light and ozone comprises exposing said substrate and said patterned layer of fluorinated photoresist to ultraviolet light whilst oxygen is in contact with the surface of said substrate and said patterned layer of fluorinated photoresist, said oxygen being converted to ozone in the presence of ultraviolet light it is particularly preferred that sold substrate and said patterned layer of fluorinated photoresist are exposed to ultraviolet light and ozone for a period of between 0.1 and 300 seconds, preferably said period is of between 1 and 60 seconds, most preferably said period is between 1 and 30 seconds. It is preferred that the source of ultraviolet light emits at a wavelength of 150 to 250 nm, more preferably of 160 to 180 nm, most preferably of less than 175 nm.

In a preferred embodiment said stop of depositing from solution a layer of organic semiconductive or conductive material comprises depositing from aqueous solution.

The substrate preferably comprises a substrate coated with a layer of conductive material, said conductive material preferably has a work function greater than 4.3 aV, more preferably said conductive material is indium-tin oxide. Most preferably said layer of conductive material is patterned, preferably said pattern comprises a series of parallel stripes. Substrates prepared according to this method may act as the anode in an addressable organic electroluminescent device.

The method of solution deposition may be any suitable method. It is preferred that said step of depositing from solution a layer of organic semiconductive material on said substrate comprises depositing said organic semiconductive material by means of spin-coating, doctor blade coating, dip coating, flexographic printing, ink-jet printing or screen printing. A most preferred method of depositing from solution a layer of organic semiconductive or conductive material on said substrate comprises depositing said organic semiconductive or conductive material using a method in which the organic semiconductive or conductive material is deposited in selected regions of the substrate, a particularly preferred method of solution deposition is by means of ink-jet printing.

In a preferred embodiment said organic semiconductive or conductive material is an organic polymer, more preferably a conductive organic polymer selected from the group consisting of doped polythiophenes and doped polyanilines, Poly(ethylenedioxythiophene) polystyrene sulfonate, known as PEDOT:PSS, is a particularly preferred semiconductive polymer. PEDOT:PSS and its use in organic electroluminescent devices is disclosed in EP09001178.

The disclosure is also directed to methods for building up devices comprising multiple layers of organic semiconductive or conductive materials. In particular the disclosed method further comprises the step of depositing from solution a further layer of material onto said layer of organic conductive or semiconductive material, preferably said further layer comprises an organic semiconductive material. The organic semiconductive material of this further layer preferably comprises a light emitting polymer selected from the group comprising polyfluorenes and poly(phenylene vinylenes). This further layer is preferably deposited from a solution comprising an aromatic hydrocarbon solvent.

In a further embodiment, for example in order to prepare an electroluminescent or photovoltaic device, a further electrode is provided to act as the cathode by depositing a layer of material of low work function onto said layer of organic conductive or semiconductive material or onto said further layer of organic semiconductive material, preferably said material of low work function is selected from the group consisting of lithium, sodium, potassium, magnesium, calcium, barium and aluminum, alloys of said metals and alloys of said metals with other metals.

The disclosure is directed to organic optoelectronic or electronic devices prepared according to the disclosed method. The disclosure is also directed to organic light emitting devices, organic transistors and organic photovoltaic devices prepared by the disclosed method.

The disclosure further provides a method for preparing an organic electronic or optoelectric device comprising providing a patterned layer in the form of a relief pattern of fluorinated polymer on a substrate exposing said substrate and said patterned layer of fluorinated polymer to ultraviolet light and ozone and depositing from solution a layer of organic semiconductive or conductive material on said substrate. In a preferred embodiment said fluorinated polymer comprises a fluorinated photoresist.

In an alternative embodiment sold fluorinated polymer is patterned by photolithography. Where the fluorinated polymer is not itself a photoresist an additional layer of photoresist is applied over the fluorinated polymer, this photoresist is then patterned leaving exposed fluorinated polymer which is then removed, for example by etching, removal of the photoresist leaves a patterned layer of fluorinated polymer. In alternative embodiments the fluorinated polymer is deposited as a patterned layer by means of printing or the layer of fluorinated polymer is mechanically patterned after deposition, preferably by embossing. The relief pattern of the fluorinated polymer may comprise features of banks and/or wells as described above with reference to the first embodiment of the disclosure. The ultraviolet light/ozone exposure is preferably carried out as described above with reference to the first embodiment of the disclosure. The further processing of the substrate is carried out as described above with reference to the first embodiment of the disclosure.

The disclosure will be described below in terms of the preparation of a substrate for a semiconductive polymer based organic light emitting device. However it will be apparent to those skilled in the art that the disclosed method is also applicable to the preparation of substrates for a range of other organic electronic and optoelectronic devices such as organic photovoltaic devices, organic transistors, and optical modulators.

Figure 1A:
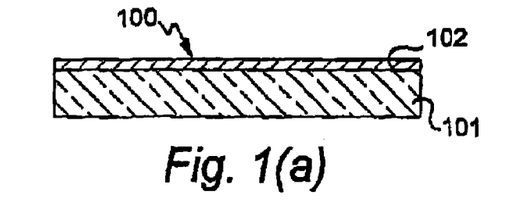
FIG. 1(a) to (i) shows a substrate for an organic optoelectronic or electronic device prepared and treated according to the disclosure.

FIG. 1(a) shows a cross sectional view of a substrate suitable for a light emitting device, 100. Substrates suitable for organic electroluminescent devices include glass, ceramics and plastics such as acrylic resins, polycarbonate resins, polyester resins, polyethylene terephthalate resins and cyclic olefin resins. The substrate may be transparent, semi-transparent or, in cases where light is to be emitted from the opposite side of the device, opaque. The substrate may be rigid or flexible and may comprise a composite material such as, for example, the glass and plastic composite disclosed in EP0949850. The substrate is coated with E layer of conductive material of high work function to form the anode of the eventual light-emitting device, where it is desired that light be emitted through the substrate this conductive material should be transparent or semi-transparent and is suitably selected from materials having a work function greater than 4.3 eV, such as ITO, tin oxide, aluminum or indium doped zinc oxide, magnesium-indium oxide, cadmium tin-oxide, gold, silver, nickel, palladium and platinum. FIG. 1(a) shows a substrate, 100, which comprises a glass substrate, 101, coated with a layer of ITO, 102. ITO may be deposited by sputtering or any other suitable method known to those in the art.

Figure 1B:
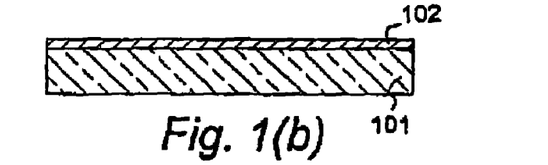
Figure 1C:
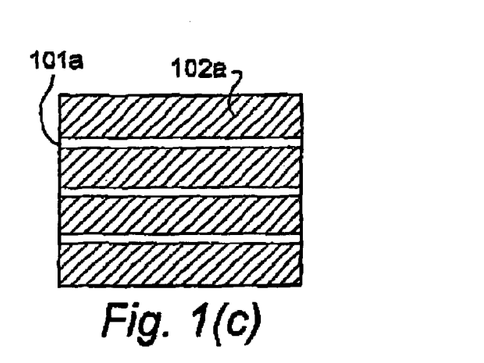

The conducive layer on the substrate is then patterned, as illustrated in FIG. 1(b). In the case of ITO this is carried out using photolithography, wherein the layer of ITO is coated with a photoresist, patterned, for example using a UV source and a photomask, and developed using the appropriate developing solution, exposed ITO is then removed by chemical etching, leaving a patterned layer of ITO. Typically the ITO is patterned to form a series of parallel stripes as shown in FIG. 1(c) which is a view from above the substrate and shows parallel stripes of ITO, 102a, and areas of exposed glass substrate, 101a, from where the ITO has been removed.

Figure 1D:
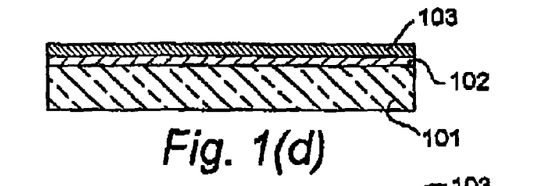

A layer of fluorinated photoresist 103 is then deposited onto the patterned ITO as shown in FIG. 1(d). The fluorinated photoresist may be deposited by spin-coating, doctor blade coating or any other suitable technique. Suitable fluorinated photoresists include copolymers of fluorinated monomers and photoactive monomers such as are disclosed in WO00/67072. In particular fluorinated polyimides comprising copolymers of photoactive imide moieties and fluorinated alkyl moieties may be used in the present invention. An example of such a fluorinated polyimide is PI2771, available from HD Microsystems.

Figure 1E:
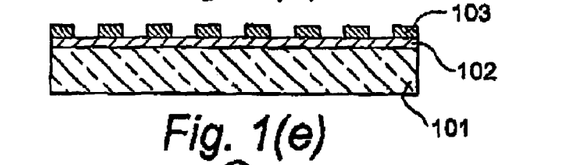
Figure 1F:
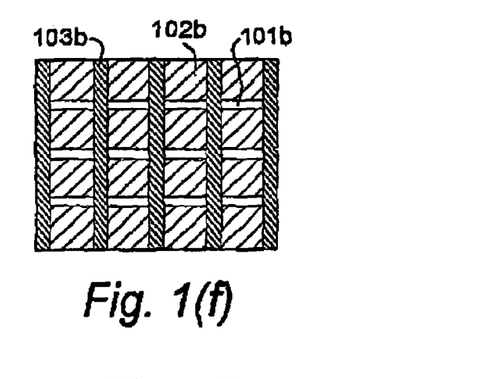
Figure 1G:
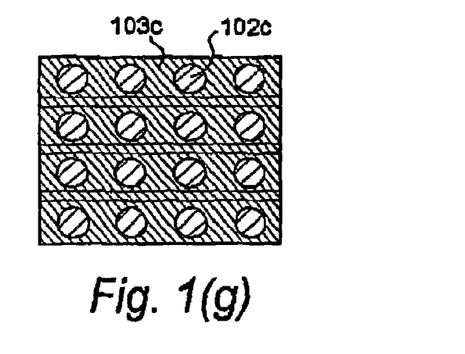

Following deposition the fluorinated photoresist is patterned using conventional photolithographic techniques, for example after deposition the fluorinated photoresist is dried, exposed to UV light through a mask, soft baked, developed using, for example, tetramethylammonium hydroxide, rinsed and hard baked. FIG. 1(e) shows a substrate, 101, with a patterned layer of ITO, 102, and a patterned layer of fluorinated photoresist, 103. Preferred patterns are those that define banks, which are one dimensional patterns, for example parallel stripes, or wells, which are two dimensional patterns of recesses in the fluorinated photoresist. A substrate patterned with banks is shown in FIG. 1(f) in which the fluorinated photoresist has been etched from the substrate to leave banks of fluorinated photoresist, 103b, in a pattern of stripes orthogonal to the stripes of ITO 102b, regions of ITO between the banks of fluorinated photoresist have been exposed. Reference 101b shows a region of exposed glass an the substrate. The banks typically have a height of 0.5 to 10 microns and a width of 10 to 100 microns and define channels containing regions of ITO having a width of 10 to 500 microns. Alternatively the fluorinated photoresist may be patterned to provide a series of wells as shown in FIG. 1(g), in this case the fluorinated photoresist 103c, is selectively removed to leave a two dimensional pattern of exposed regions of ITO, 102c. Wells may have a diameter of 10 to 100 microns. Clearly the dimensions of banks or wells will be dependent on the intended use of the organic optoelectronic or electronic device, for example a microdisplay will require a very high degree of resolution.

It is advantageous if the fluorinated photoresist is etched so as to leave banks having an negative wall profile as illustrated in FIG. 4(a), which shows a substrate 400 having a patterned layer of ITO 402 on a glass substrate 401 and an overlying layer of banks of fluorinated photoresist 403. The banks 403 have a negative wall profile, being narrower in proximity to the substrate, typically a bank will have an upper width of around 40 microns and a lower width of around 20 to 38 microns. Techniques for obtaining banks with a negative wall profile are known in the art and typically, in the case of a negative photoresist, involve underexposing and then overdeveloping the photoresist. The provision of banks with a negative wall profile is beneficial for the further processing of the substrate, in particular banks having a negative wall profile aid the patterned deposition of the metallic cathode, EP0969701 discloses the use of banks having a negative wall profile in the deposition of a cathode in an organic electroluminescent device. Where the fluorinated photoresist comprises a pattern of wells these generally have a positive wall profile, this enables any deposited solution to flow more easily into the well. Techniques for obtaining wells with a positive wall profile are known in the art and typically, in the case of a negative photoresist, involve overexposing and then underdeveloping the photoresist. FIG. 4(b) shows a substrate 400 having a glass substrate 401, a patterned layer of ITO 402 and a layer of fluorinated photoresist etched to form a pattern of wells having a positive wall profile 404. Such a substrate will typically further comprise a layer of fluorinated photoresist patterned to form banks 403, such as those shown in FIG. 4(b), Such a further layer of fluorinated photoresist may be deposited onto the substrate containing the patterned layer of wells by procedures known to the person skilled in the art such as standard photolithographic techniques. In substrates comprising two layers of photoresist such as that shown in FIG. 4(b) the lower layer of photoresist comprising wells is a fluorinated photoresist. The other photoresist material may be selected from the range of photoresists known in the art and in particular may be selected for a desirable property such as, where appropriate, its ability to form banks having a negative wall profile. For the purposes of further solution processing of the substrates it is preferred that in cases when substrates comprise two layers of photoresist both of these layers comprise a fluorinated photoresist.

The choice of patterning the fluorinated photoresist to form banks or wells rests on the nature of the eventual light emitting device. If it is desired that the device emit light of a single colour, i.e. a monochrome device, it is sufficient to pattern the substrates with banks. If it is desired that the device emit in more than one colour, in particular in red, green and blue, the fluorinated photoresist will generally be patterned to form wells thus enabling light emitting materials of different colours to be deposited separately.

Although solutions of organic semiconductive or conductive polymers may be directly applied to the above prepared substrates and the deposited solutions will distribute to areas of the substrate free of fluorinated photoresist further treatment of the substrate has been found to increase the propensity of the deposited solution to flow to areas free of fluorinated photoresist, in the present case thee are areas of exposed ITO. The effect of this further treatment is to decrease the surface energy at the fluorinated photoresist, so increasing its tendency to repel the deposited solution, and to increase the surface energy at the areas of the substrate not coated with fluorinated photoresist, so increasing their tendency to attract the deposited solution, in this case the treatment acts to increase the surface energy of the ITO. The substrate may be treated with a plasma such as an argon plasma, atmospheric plasma, oxygen plasma, aqua regia or peroxide but it has been found particularly effective to treat the substrate by exposing it to ultraviolet (UV) light and ozone. This treatment has significant advantages over plasma treatments and in particular over the prior art $O_2/CF_4$ plasma treatment.

A convenient method for carrying out the UV/ozone treatment is to expose the substrate to a UV light source in an oxygen atmosphere. While not wishing to be bound by theory it is considered that the UV light source cracks atmospheric oxygen generating ozone and oxygen radicals resulting in the surface of the substrate being exposed simultaneously to UV light and ozone, the ozone decomposes generating further oxygen radicals. It is considered that these active species act to modify the surface properties of the substrate.

Figure 1H:
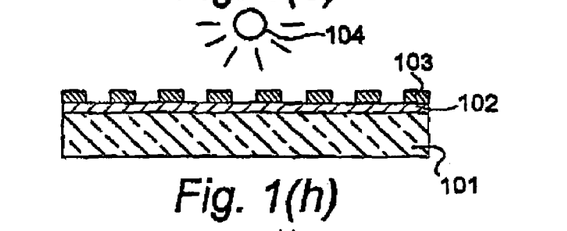

This treatment is shown schematically in FIG. 1(h) in which a UV light source, 104, is shone onto a patterned substrate, 101, 102, 103. The UV/ozone treatment may be carried out under a partial vacuum. Even in a partial vacuum it has been established that sufficient ozone can be generated from the residual oxygen for treatment of the substrate surface. It has been found efficacious to generate a flow of oxygen, and therefore ozone, over the surface of the substrate, this can be achieved by means of, for example, a vacuum pump.

The UV source may comprise a UV lamp having for example a poser of 5 to 12 mW/cm$^2$ and emitting at a wavelength of 150 to 250 nm, preferably of 160 to 180 nm, most preferably of less than 175 nm. The distance of the UV source from the substrate may be of the order of 1 to 10 mm, clearly there is a need to increase the power output of the UV source as its distance from the substrate is increased.

The duration of the UV/ozone treatment may be of the order of 1 to 300 s. It has been determined that treatment times of between 1 and 15 s provide sufficient change in the surface properties of the substrate whilst avoiding significant deterioration in the performance of the eventual device due to degradation during the treatment. These shorter processing times provide a significant improvement over the prior art $O_2/CF_4$ plasma treatment in which processing times of 15 to 30 minutes are commonly used.

The UV/ozone surface treatment of the disclosure does not require the use of a vacuum chamber as in the prior art $O_2/CF_4$ plasma treatment. This makes the disclosed method suitable for introduction into continuous production lines in which, for example, substrates coated with a patterned fluorinated photoresist could be passed along a conveyor belt under a suitably positioned UV source.

It has been determined that the combination of the fluorinated photoresist with the above described UV/ozone treatment increases the difference in contact angle between the hydrophilic substrate material, for example ITO or glass, and the hydrophobic fluorinated photoresist to ensure that the organic conductive or semiconductive materials deposited in solution onto the substrate do not flow out of the channels or wells defined by the fluorinated photoresist into areas of the substrate where they are not desired. Although the patterned fluorinated photoresist repels any deposited solution sufficiently for patterns of organic material to be formed on the substrate the combination of the fluorinated photoresist and the UV/ozone treatment has been found to be more effective, allowing a greater degree of pattern resolution and decreasing the tendency of deposited solutions to flow out of the banks or wells. The UV/ozone treatment has been found to be particularly advantageous in the treatment of ITO coated glass substrates with a patterned fluorinated photoresist, allowing aqueous solutions to be deposited on the substrates with high degree of pattern resolution.

The above described UV/ozone treatment may be applied to any substrate comprising a layer of fluorinated polymer having a relief pattern with the aforementioned advantages over the prior art $O_2/CF_4$ plasma treatment methods such as shorter processing times, avoidance of the use of vacuum or pressure chambers, compatibility with batch processes and avoidance of the use of environmentally harmful gases. For the purposes of the disclosure fluorinated polymers are considered to comprise those polymers which include covalently bound fluorine throughout the bulk material as opposed to polymers only the surfaces of which have been fluorinated. Substrates with patterned layers of fluorinated polymers may be prepared by photolithography, where the fluorinated polymer is not a photoresist this is achieved by providing a further layer of photoresist over the layer of fluorinated polymer, patterning the photoresist, developing the photoresist, removing the photoresist from either exposed or unexposed regions thereby exposing the underlying fluorinated polymer and removing the exposed fluorinated polymer, for example by etching, such a process is described in WO00/76008. Alternatively the fluorinated polymer may be provided in the form of a relief pattern on the surface by printing or microprinting, for example by ink-jet printing or microcontact printing. The layer of fluorinated polymer may be patterned mechanically, for example by embossing, as described in WO00/70406 or WO96/21626. Substrates prepared using a fluorinated polymer and treated using UV/ozone may be processed in the same manner as substrates prepared using a fluorinated photoresist.

Figure 1I:
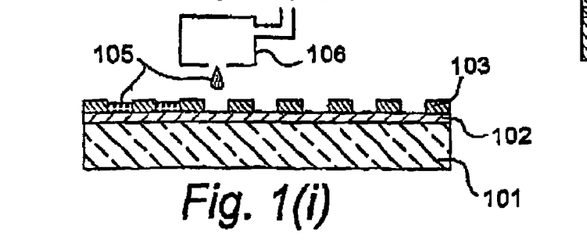

Suitable methods for the deposition of the organic semiconductive or conductive material from solution include methods where the organic material is deposited onto selected regions of the substrate, i.e. into the channels between adjacent banks or into the wells, such methods include ink-jet printing, flexographic printing. Alternatively methods may be used in which the organic semiconductive or conductive material is deposited over the entire surface of the substrate and flows preferentially into the channels or wells according to the difference in surface energies between the different regions of the substrate, such methods include spin coating, doctor blade coating or dip coating. FIG. 1(*i*) shows a solution of organic semiconductive or conductive material, 105, being ink-jet printed from an ink-jet head, 106, onto a substrate, 101, 102, 103. The choice of method of deposition depends on the nature of the desired organic electroluminescent device, for example, if it is desired to prepare a monochrome display the semiconductive organic polymers necessary to form the layers of the device may be deposited by spin coating solutions of the materials onto a substrate patterned with banks and channels as in FIG. 1(*f*). If it is desired to produce a multicolour display the semiconductive polymers necessary to form the layers of the device may be deposited by ink-jet printing them into the wells of a substrate as shown in FIG. 1(*g*), in this case different coloured light-emitting materials will be deposited into different wells as appropriate.

The choice of organic semiconductive or conductive material which is deposited will depend on the nature of the eventual device, in the case of an organic electroluminescent device the organic semiconductive material may comprise a polymeric light emitting material or a non-polymeric light emitting material, so-called small molecules, examples of polymer materials suitable for use in electroluminescent devices are disclosed in WO90/13148, examples of small molecules suitable for use in electroluminescent devices are disclosed in U.S. Pat. No. 4,539,507. Small molecule organic electroluminescent devices have been prepared by solution processes such as ink-jet printing, as disclosed in EP0880303. Organic electroluminescent devices typically comprise further layers of materials such as charge transport layers. The solvent used for the deposition of the organic material will be selected according to the solubility of the material and the requirements of the particular deposition technique.

Figure 2:
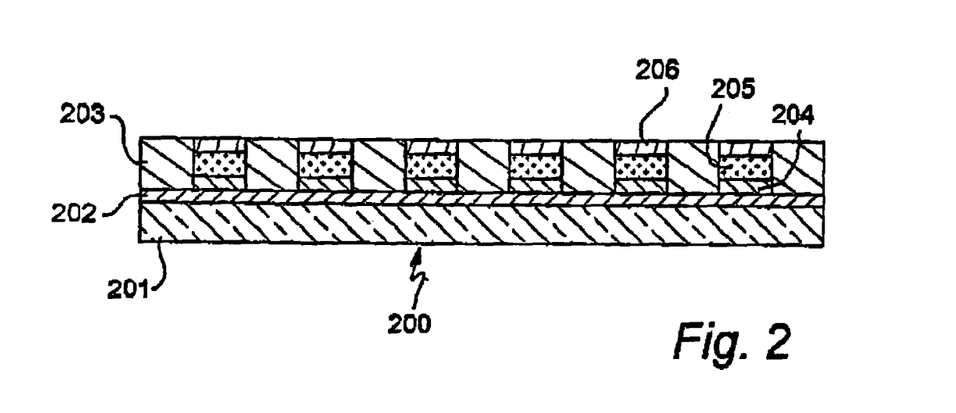
FIG. 2 shows an organic light emitting device according to the disclosure.

The disclosed method will be exemplified for the preparation of a monochrome polymeric electroluminescent device with reference to FIG. 2. FIG. 2 shows a polymeric organic electroluminescent device, 200, comprising, a glass substrate, 201, a layer of ITO patterned into parallel stripes forming the anode of the device, 202, and a series of parallel banks of fluorinated photoresist orthogonal to the stripes of ITO, 203, such a substrate is prepared as described in detail above.

A layer of hole-transporting material, 204, is then deposited upon the patterned ITO, the preferred hole-transport material used in the art is a conductive organic polymer such as polystyrene sulfonic acid doped polyethylene dioxythiophene (PEDOT:PSS) as disclosed in WO98/05187, although other hole transporting materials such as doped polyaniline may also be used. The hole-transporting material is deposited by spin coating from an aqueous solution, the aqueous solution preferentially flows into the channels of high surface energy being repelled by the fluorinated photoresist banks of lower surface energy. The aqueous solution typically has a concentration of 1 to 10% of hole-transporting material and is spin-coated at for example 1000 to 6000 rpm. The aqueous solution is then allowed to evaporate leaving a layer of hole-transporting material of thickness 10 nm to 200 nm.

A layer of light-emitting polymer, 205, such as a polyfluorene or a poly(phenylene vinylene), is then deposit upon the layer of hole-transporting material by spin-coating. Typically the light-emitting polymer will be spin-coated from a solution of aromatic hydrocarbons such as toluene or xylene, further examples of suitable solvents are disclosed in WO01/16251. The light-emitting polymer may be spin-coated from a solution of concentration 0.5 to 10%, the thickness of the deposited layer of light-emitting polymer is generally 10 nm to 300 nm.

A cathode, 208, is then deposited onto the layer of light-emitting material. Examples of suitable materials for the cathode include Li, Na, K, Rb, Be, Mg, Ca, Sr, Ba, Yb, Sm and Al. The cathode may comprise an alloy of such metals or an alloy of such metals in combination with other metals, for example the alloys MgAg and LiAl. The cathode preferably comprises multiple layers, for example Ca/Al or LiAl/Al. The device may further comprise a layer of dielectric material between the cathode and the emitting layer, such as is disclosed in WO 97/42666. In particular it is preferred to use an alkali or alkaline earth metal fluoride as a dielectric layer between the cathode and the emitting material. A particularly preferred cathode comprises LiF/Ca/Al, with a layer of LiF of thickness from 1 to 10 nm, a layer of Ca of thickness of 1 to 25 nm and a layer of Al of thickness 10 to 500 nm. Alternatively a cathode comprising $BaF_2$/Ca/Al may be used.

The cathode material is typically deposited by vapour deposition. For the production of a passive matrix display comprising pixels capable of being individually addressed the cathode is patterned into parallel stripes orthogonal to the parallel stripes of the ITO anode. The patterning of the cathode is generally carried out by depositing the cathode material through a patterned shadow mask. Banks of fluorinated photoresist suitably shaped with an negative wall profile may act as an integral shadow mask allowing the material of the cathode to be vapour deposited in parallel stripes, such a method of cathode deposition and patterning is disclosed in EP0969701. Alternatively an external shadow mask may be used to deposit the patterned cathode layer.

Following cathode deposition polymeric electroluminescent devices are generally encapsulated to protect the materials in the device from oxygen and moisture. Encapsulation may be carried out by means of enclosing the device in a metal can or glass cover to protect the device from the environment, an oxygen or moisture absorbent may be including within the metal can or glass cover, such a technique is disclosed in U.S. Pat. No. 6,080,031. Alternatively devices may be encapsulated by laminating an impermeable composite material over the device as is disclosed in WO00/36661.

Organic electroluminescent devices may contain other active layers such as electron-transport layers and electron or hole-blocking layers and such devices may comprise both layers of polymeric materials and layers of non-polymeric materials.

Figure 3:
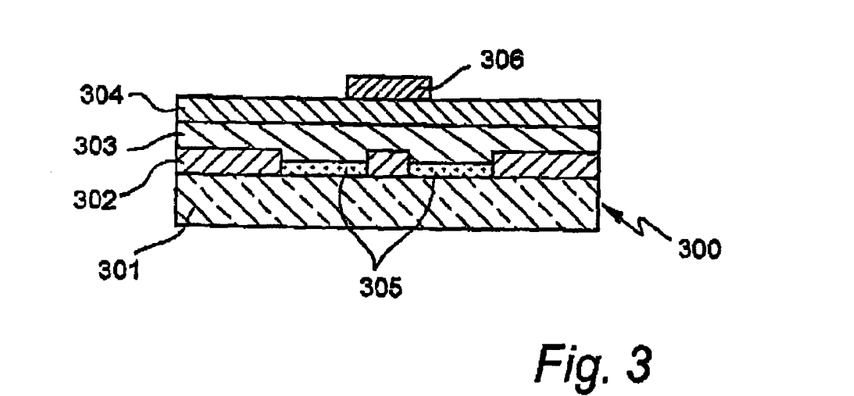
FIG. 3 shows an organic transistor according to the disclosure.

The polymeric transistor of FIG. 3 is typical of the organic electronic devices which may be prepared using the method of the present invention, similar transistors are disclosed in WO01/47045. The transistor, 300, comprises a glass substrate, 301, a patterned layer of fluorinated photoresist, 302, source and drain electrodes, 305, formed of a conducting organic material such as PEDOT:PSS, a layer of semiconducting polymer such as a polyfluorene, 303, a layer of insulating material such as polyvinylphenol, 304 and a gate electrode, 306, formed from a conducting organic material such as PEDOT;PSS. In the method of the present invention a layer of fluorinated photoresist is deposited onto the glass substrate, patterned to define the eventual source and drain electrodes as well as interconnect lines linking the transistor to contact pads or to other transistors and optionally exposed to the above described UV/ozone treatment. The regions of exposed glass have a higher surface energy than the regions of fluorinated photoresist such that when the solution of conducting polymer is deposited onto the substrate it preferentially flows into the regions of exposed glass,this difference in surface energy may be further enhanced by exposing the fluorinated photoresist to the above described UV/ozone treatment. The conducting polymer is generally deposited by ink-jet printing as are the layer of insulating material 304 and the gate electrode 306. Further details as to alternate device structures and their modes of operation can be found in the aforementioned WO01/47045.

Organic photovoltaic devices comprising, between two electrodes, one or more organic electron donors and one or more organic electron acceptors in a blend or layered structure may also be prepared using the method of the present invention. The method of the present invention is particularly suited to the preparation of organic photovoltaic devices comprising a blend of two semiconductive polymers such as devices of the type disclosed in U.S. Pat. No. 5,670,791.

EXAMPLES

In the following examples the fluorinated photoresist used is a fluorinated polyimide PI2771 obtained from HD Microsystems. The polyimide photoresist is a Brewer Polyin T15010. The UV light source is an Ushlo UER 200-172 lamp providing 7 mW/cm$^2$ at a wavelength of 172 nm, the UV light source was positioned 1.1 mm from the substrate and was also used to generate ozone as described above. The $O_2/C_4$ plasma treatment was carried out in a RF barrel etcher of dimensions 300 mm diameter, 450 mm depth, with a gas mixture of 0.5-2% $CF_4$ in oxygen, at a pressure of 1.5 Torr and a power of 400 W.

Comparison of prior art polyimide coated substrate with subsequent $O_2/CF_4$ plasma treatment and the use of a fluorinated polyimide coated substrate with subsequent UV/ozone treatment according to one aspect of the disclosure.

Experiments were carried out to compare the effect of the UV/ozone treatment with the prior art $O_2/CF_4$ plasma treatment on the contact angle of an aqueous solution on the surfaces of glass substrates coated with ITO, polyimide and fluorinated polyimide. Techniques for measuring contact angles are well known in the prior art, in the present example a Kruss DSA10 Drop Shape Analysis contact angle measuring system was used. The results are shown in Table 1, which shows the effect of the various surface treatments on the contact angle of an aqueous solution at the surface of the coated substrate. In Table 1 contact angles are shown in degrees, ITO refers to the ITO coated glass substrate, fPI refers to the glass substrate coated with fluorinated polimide and PI refers to the glass substrate coated with polyimide.

TABLE 1

| Substrate | $O_2/CF_4$ plasma | UV/ozone |
|---|---|---|
| ITO | 15 | 8 |
| fPI | — | 60 |
| PI | 110 | 10 |

For providing patterns of solutions of organic materials on coated substrates it is necessary that there is a sufficiently large difference in the contact angle of the solution on the regions in which it is desired for the solution to be provided and the contact angle of the solution on the regions in which it is desired to have none of the deposited solution. In the present example it is desired to have a suitably large difference between the contact angle of the aqueous solution on the ITO and the contact angle of the aqueous solution on the polyimides, in this way deposited solution will preferentially flow onto the ITO. It can be seen from Table 1 that although the largest difference in contact angle is between the $O_2$/CF4 plasma treated ITO and the $O_2/CF_4$ plasma treated polyimide PI, the difference in contact angle between the UV/ozone treated ITO and the UV/ozone treated fluorinated polyimide fPI is sufficient for the deposited aqueous solution to flow preferentially onto the ITO coated substrate. The above tests demonstrate that the substrates with patterned fluorinated photoresist are suitable for preparing organic electronic or optoelectronic devices by solution processing.

Example of the Preparation of an Organic Electroluminescent Device

A glass substrate coated with ITO patterned to form parallel lines of thickness 270 microns with gaps of 30 microns between the lines was provided. A layer of the fluorinated polyimide PI2771 obtained from HD Microsystems was then spin coated onto the substrate, the polyimide is patterned to form parallel banks having a height of 10 microns and a width of 40 microns, leaving a channel of exposed ITO between the banks having a width of 260 microns.

The ITO coated glass substrate with the patterned layer of fluorinated polyimide is then exposed to UV and ozone for 15 seconds using the above described equipment, A layer of PEDOT:PSS comprising a 0.5% aqueous solution (available from Bayer as Baytron) is then ink-jet printed onto the substrate forming a layer of thickness 50 nm over the exposed regions of ITO (suitable ink-jet printers are available from Litrex, USA). A layer of a polyfluorene light-emitting polymer is the ink-jet printed onto the PEDOT:PSS layer from a 1.5% solution in xylene:trimethylbenzone solvent In this way layer of polyfluorene of thickness 100 nm is formed over the PEDOT:PSS. Microscopy can be used to determine that the deposited polymer lies within the channels and has not flowed onto the banks.

A cathode comprising a layer of calcium of thickness 50 nm and a layer of aluminum of thickness 250 nm is then deposited upon the polyfluorene layer by means of vacuum deposition. Devices are then encapsulated using a metal can.

Operation of the devices prepared by the above method show device efficiency and lifetime to be equivalent to the prior art process involving a standard (i.e. non-fluorinated) polyimide and $O_2/CF_4$ treatment with the significant advantage that the process does not require prior treatment of the bank material and in particular does not require processing in a vacuum chamber and the use of harmful gases.

No doubt the teaching herein makes many other embodiments of, and effective alternatives to, the disclosed method apparent to a person skilled in the art. The disclosure is not limited to the specific embodiments described herein but encompasses modifications which would be apparent to those skilled in the art and lying with the spirit and scope of the attached claims.

The invention claimed is:

1. Method for preparing an organic electronic or optoelectronic device comprising depositing a layer of fluorinated photoresist on a substrate, patterning said layer of fluorinated photoresist to form a relief pattern and depositing from solution by ink-jet printing a layer of organic semiconductive or conductive material in the relief pattern, wherein the photoresist and the substrate have sufficiently different contact angles with the solution, thereby ensuring that the solution is contained within the relief pattern.

2. Method according to claim 1 wherein said fluorinated photoresist comprises a fluorinated polyimide.

3. Method according to claim 1 wherein said relief pattern comprises banks.

4. Method according to claim 1 wherein said relief pattern comprises wells.

5. Method according to claim 4 wherein said wells have a positive wall profile.

6. Method according to claim 4 wherein said relief pattern of said layer of fluorinated photoresist or fluorinated polymer comprises a further, overlying, layer of fluorinated photoresist or fluorinated polymer patterned to comprise banks.

7. Method according to claim 3 wherein said banks have a negative wall profile.

8. Method according to claim 1 comprising exposing said substrate and said patterned layer of fluorinated photoresist to argon plasma, atmospheric plasma, ultraviolet light and ozone, oxygen plasma, aqua regia or peroxide prior to depositing from solution a layer of organic semiconductive or conductive material on said substrate.

9. Method according to claim 8 comprising exposing said substrate and said patterned layer of fluorinated photoresist to ultraviolet light and ozone prior to depositing from solution a layer of organic semiconductive or conductive material on said substrate.

10. Method according to claim 1 wherein said step of depositing from solution a layer of organic semiconductive or conductive material comprises depositing from aqueous solution.

11. Method according to claim 1 wherein said substrate comprises a substrate coated with a layer of conductive material.

12. Method according to claim 11 wherein said layer of conductive material is patterned.

13. Method according to claim 1 wherein said organic semiconductive or conductive material is an organic polymer.

14. Method according to claim 13 wherein said organic conductive or semiconductive material is a conductive organic polymer selected from the group consisting of doped polythiophenes and doped polyanilines.

15. Method according to claim 1 further comprising the step of depositing from solution a further layer of material onto said layer of organic conductive or semiconductive material.

16. Method according to claim 15 wherein said further layer of material comprises an organic semiconductive material.

17. Method according to claim 15 comprising depositing said further layer from a solution comprising an aromatic hydrocarbon solvent.

18. Method according to claim 1 further comprising the step of depositing a layer of material of low work function onto said layer of organic conductive or semiconductive material.

19. Method according to claim 11 wherein said conductive material has a work function greater than 4.3 eV.

20. Method according to claim 19 wherein said conductive material is indium-tin oxide.

21. Method according to claim 12 wherein said layer of conductive material is patterned with a series of parallel stripes.

22. Method according to claim 14 wherein said organic conductive material comprises poly(ethylenedioxythiophene) polystyrene sulfonate.

23. Method according to claim 16 wherein said organic semiconductive material of said further layer of material comprises a light emitting polymer selected from the group consisting of polyfluorenes and poly(phenylene vinylenes).

24. Method according to claim 16 comprising depositing said further layer from a solution comprising an aromatic hydrocarbon solvent.

25. Method according to claim 18 wherein said material of low work function is selected from the group consisting of lithium, sodium, potassium, magnesium, calcium, barium and aluminum, alloys of said metals and alloys of said metals with other metals.

26. Method for preparing an organic electronic or optoelectronic device comprising providing a patterned layer in the form of a relief pattern of fluorinated polymer on a substrate, exposing said substrate and said patterned layer of fluorinated polymer to ultraviolet light and ozone, and depositing from solution a layer of organic semiconductive or conductive material on said substrate.

27. Method according to claim 26 wherein said fluorinated polymer comprises a fluorinated photoresist.

28. Method according to claim 26 comprising patterning said layer of fluorinated polymer by photolithography.

29. Method according to claim 26 comprising patterning said layer of fluorinated polymer by printing.

30. Method according to claim 26 comprising patterning said layer of fluorinated polymer mechanically.

31. Method according to claim 26 wherein said step of exposing said substrate and said patterned layer of fluorinated polymer to ultraviolet light and ozone comprises exposing said substrate and said patterned layer of fluorinated polymer to ultraviolet light while oxygen is in contact with the surface of said substrate and said patterned layer of fluorinated polymer, said oxygen being converted to ozone in the presence of ultraviolet light.

32. Method according to claim 26 wherein said substrate and said patterned layer of fluorinated polymer are exposed to ultraviolet light and ozone for a period of between 0.1 second and 300 seconds.

33. Method according to claim 26 wherein said step of depositing from solution a layer of organic semiconductive or conductive material on said substrate comprises depositing said organic semiconductive or conductive material by means of spin-coating, doctor blade coating, dip coating, flexographic printing, ink-jet printing or screen printing.

34. Method according to claim 33 wherein said step of depositing from solution a layer of organic semiconductive or conductive material on said substrate comprises depositing said organic semiconductive or conductive material by means of ink-jet printing.

35. Method according to claim 30 comprising patterning said layer of fluorinated polymer by embossing.

36. Method according to claim 32 wherein said period is of between 1 second and 60 seconds.

37. Method according to claim 36 wherein said period is of between 1 second and 30 seconds.

* * * * *